(12) United States Patent
Oka

(10) Patent No.: US 8,036,303 B2
(45) Date of Patent: Oct. 11, 2011

(54) TRANSMITTER APPARATUS

(75) Inventor: Tatsuto Oka, Kanagawa (JP)

(73) Assignee: Panasonic Corporation, Osaka (JP)

( * ) Notice: Subject to any disclaimer, the term of this patent is extended or adjusted under 35 U.S.C. 154(b) by 706 days.

(21) Appl. No.: 12/159,197

(22) PCT Filed: Dec. 15, 2006

(86) PCT No.: PCT/JP2006/325074
§ 371 (c)(1),
(2), (4) Date: Jun. 25, 2008

(87) PCT Pub. No.: WO2007/074663
PCT Pub. Date: Jul. 5, 2007

(65) Prior Publication Data
US 2010/0220770 A1    Sep. 2, 2010

(30) Foreign Application Priority Data

Dec. 27, 2005   (JP) ................................. 2005-375417

(51) Int. Cl.
*H04L 27/00* (2006.01)
(52) U.S. Cl. ........ 375/295; 375/219; 375/296; 375/297; 375/299; 375/302; 455/216; 455/255
(58) Field of Classification Search .................. 375/130, 375/136, 135, 146, 147, 150, 219, 220, 221, 375/223, 229, 286, 295, 296, 297, 316
See application file for complete search history.

(56) References Cited

U.S. PATENT DOCUMENTS

| 5,251,330 | A | 10/1993 | Chiba | |
|---|---|---|---|---|
| 7,426,377 | B2 * | 9/2008 | Tanaka et al. | 455/255 |
| 7,558,333 | B2 * | 7/2009 | Liu | 375/297 |
| 7,787,563 | B2 * | 8/2010 | Tal et al. | 375/297 |
| 7,929,638 | B2 * | 4/2011 | Sorrells et al. | 375/295 |
| 2004/0087291 | A1 * | 5/2004 | Wada | 455/216 |
| 2005/0079835 | A1 | 4/2005 | Takabayashi et al. | |
| 2005/0100079 | A1 * | 5/2005 | Sanada et al. | 375/141 |
| 2005/0202789 | A1 | 9/2005 | Tanabe et al. | |
| 2006/0262843 | A1 * | 11/2006 | Kim et al. | 375/238 |
| 2011/0051836 | A1 * | 3/2011 | Lee | 375/268 |

FOREIGN PATENT DOCUMENTS

| JP | 03-104422 | 5/1991 |
|---|---|---|
| JP | 6-54877 | 5/1991 |
| JP | 8-186607 | 7/1996 |
| JP | 10-294762 | 11/1998 |
| JP | 2004-356835 | 12/2004 |
| JP | 2005-057665 | 3/2005 |
| JP | 2005-295537 | 10/2005 |
| WO | 91/00653 | 1/1991 |

* cited by examiner

OTHER PUBLICATIONS

International Search Report dated Mar. 20, 2007.

*Primary Examiner* — Shuwang Liu
*Assistant Examiner* — Hirdepal Singh
(74) *Attorney, Agent, or Firm* — Dickinson Wright PLLC

(57) ABSTRACT

A transmitter apparatus capable of reducing the distortions of vector modulated waves. This apparatus includes variable coefficient filters (110,112) in a stage preceding an amplitude signal voltage generating part (104) and also includes variable coefficient filters (111,113) in a stage preceding a phase modulated wave generating part (105). These variable coefficient filters (110-113) are used to perform a pulse shaping, thereby adjusting the delay between an amplitude component modulated signal (r(t)) and a phase component modulated signal (SC(t)) whereby a resolution, which is finer than the sampling period of a signal processing, can be used to adjust the delay time difference between the amplitude component modulated signal (r(t)) and the phase component modulated signal (SC(t)). As a result, the distortions of vector modulated waves (Srf(t)) can be reduced to a sufficiently small level.

14 Claims, 17 Drawing Sheets

TRANSMITTER APPARATUS

TECHNICAL FIELD

The present invention relates to a transmitting apparatus that synthesizes an envelope signal and a phase modulation signal and transmits the result as a vector modulation wave.

BACKGROUND ART

A power amplifier provided in the output section of a transmitting apparatus in a wireless communication system requires both low distortion and efficiency. Power amplifiers are classified into amplifiers using transistors for the current source or using transistors for switching operation. Amplifiers using transistors for the current source may be class A amplifiers, class AB amplifiers, class B amplifiers and class C amplifiers. Further, amplifiers using transistors for switching operation may be class D amplifiers, class E amplifiers and class F amplifiers.

Conventionally, in high-frequency power amplifiers that amplify modulation waves including envelope fluctuation components, class A or class AB linear amplifiers are used in order to linearly amplify envelope fluctuation components. However, there is a drawback that the power efficiency of linear amplifiers is inferior compared to non-linear amplifiers such as class C amplifiers or class E amplifiers.

As a result, when a conventional linear amplifier is used for a mobile type wireless apparatus such as a mobile telephone or mobile information terminal apparatus using a battery as a power source, there is the drawback that usage time is short. Further, when a conventional linear amplifier is used for a base station apparatus in a mobile communication system provided with a plurality of large power transmission apparatuses, there is a drawback of causing an increase in the size of the base station apparatus and the heating value.

Therefore, as a transmission apparatus with efficient transmission functions, there is a transmission apparatus that attaches an envelope component to a phase modulation wave by dividing a modulation signal into the amplitude component (envelope component) and the phase component, generating a phase modulation wave with constant envelope from the phase component and changing the power supply voltage of a non-linear amplifier according to the envelope component and that causes a vector modulation wave including an envelope fluctuation component.

FIG. 1 illustrates a configuration of a transmitting apparatus as a first conventional example described above. This transmitting apparatus 10 as the first conventional example is formed with transmission data signal input terminal 11, I signal generating section 13, Q signal generating section 14, amplitude signal voltage generating section 15, phase modulation wave generating section 16, power amplifying section 17 and transmission output terminal 18. I signal generating section 13 and Q signal generating section 14 form complex envelope computing section 12.

In wireless communication system, a transmission signal with information to be transmitted is transmitted as a modulation wave by means of amplitude r(t) and phase φ(t) of a carrier wave. In this case, if the angular frequency of carrier wave is $\omega_c$, modulation wave S(t) to be transmitted to a channel is expressed by the following equation.

$$S(t)=r(t)\cdot\exp[\omega_c\cdot t+\phi(t)] \tag{Equation 1}$$

Here, phase modulation wave $S_c(t)$ with a constant envelope is expressed by the following equation.

$$Sc(t)=\exp[\omega_c\cdot t+\omega(t)] \tag{Equation 2}$$

In the modulation step in signal processing, a transmission data signal is often processed as the I signal I(t) and the Q signal (Q) that are the in-phase component and quadrature component of complex envelope. These are collectively referred to as "IQ signals" and are expressed by the following equations.

$$I(t)=r(t)\cdot\cos[\phi(t)] \tag{Equation 3}$$

$$Q(t)=r(t)\cdot\sin[\phi(t)] \tag{Equation 4}$$

Further, if an amplitude signal r(t) and a phase signal φ(t) are expressed by IQ signals, equations are as follows.

$$r(t)=\{I(t)^2+Q(t)^2\}^{1/2} \tag{Equation 5}$$

$$\phi(t)=\tan^{-1}\{Q(t)/I(t)\} \tag{Equation 6}$$

In FIG. 1, a transmission data signal inputted from transmission data signal input terminal 11 is converted into an I signal (I)t in I signal generating section 13 and a Q signal Q(t) in Q signal generating section 14.

Amplitude signal voltage generating section 15 and phase modulation wave generating section 16 generate an amplitude signal r(t) and phase modulation wave $S_c(t)$ from the I signal I(t) and the Q signal Q(t), respectively.

Phase modulation wave $S_c(t)$ that is a carrier wave having angular frequency $\omega_c$ and phase-modulated by the phase signal φ(t), is generated in phase modulation wave generating section 16 and inputted to power amplifying section 17.

On the other hand, the amplitude signal r(t) is used to set a power supply voltage value of power amplifying section 17. The amplitude of the output signal of power amplifying section 17 changes according to the power supply voltage value. That is, the envelope of the output signal of power amplifying section 17 changes according to the amplification signal r(t).

As a result, the signal acquired by multiplying power supply voltage value r(t) of power amplifying section 17 and phase modulation wave $S_c(t)$, which is the output signal of phase modulation wave generating section 16, is amplified by gain G of power amplifying section 17, and outputted as RF vector modulation wave Srf(t). That is, vector modulation wave Srt(t) is expressed by the following equation.

$$Srf(t)=G\cdot r(t)\cdot\exp[\omega_c\cdot t+\phi(t)] \tag{Equation 7}$$

As described above, the modulation wave to be inputted to the input terminal of power amplifying section 17 is phase modulation wave $S_c(t)$ with a fixed envelope level, and, consequently, an efficient non-linear amplifier can be used for power amplifying section 17 as a high frequency amplifier, so that it is possible to provide a efficient transmitting apparatus (for example, see Patent Document 1).

FIG. 2 shows a configuration example of amplitude signal voltage generating section 15 and phase modulation generating section 16 of transmitting apparatus 20 in the first conventional example. In amplitude signal voltage generating section 15, amplitude signal generating section 21 computes and generates an amplitude signal r(t) by equation 5 and DA converter 22 generates amplitude signal voltage. In phase modulation wave generating section 16, phase signal generating section 23 computes and generates a phase signal φ(t) by equation 6, DA converter 24 generates phase signal voltage and phase modulating section 25 phase-modulates a carrier wave by the phase signal φ(t) to form phase modulation wave $S_c(t)$.

FIG. 3 is a block diagram for further explanation of the first conventional example. In FIG. 3, the configurations of I signal generating section 13 and Q signal generating section 14 forming complex envelope computing section 12 are shown in detail.

Recently, many wireless communication systems employ a digital modulation scheme. In this case, information to be transmitted is a digital value, and, consequently, a transmission data signal can be expressed by a discrete-time pulse sequence. However, this pulse shape signal excessively occupies a wide frequency bandwidth and therefore is generally processed as continuous-time, smoothed waveforms I(t) and Q(t) by band-limiting discrete-time pulse shape waveforms Ip(t) and Qp(t) in filters. In this case, for the filter, a pulse shaping filter (for example, root cosine roll-off filter) that is directed to performing band-limitation while canceling the intersymbol interference between pulses, is used.

Therefore, in transmitting apparatus 30 shown in FIG. 3, when I signal generating section 13 and Q signal generating section 14 receives as input a transmission data signal from transmission data signal input terminal 11, first, pulse generating sections 31 and 32 convert the transmission data signal into an I component pulse signal Ip(t) and a Q component pulse signal Qp(t), respectively, and pulse shaping filters 33 and 34 perform band-limitation and outputs the I signal I(t) and the Q signal Q(t), respectively.

Although digital filters are generally used for pulse shaping filters 33 and 34 in most cases, analogue filters may be used.

Further, when digital filters are used for pulse shaping filters 33 and 34, although FIR filters (finite impulse response filters) are generally used in most cases, IIR filters (infinite impulse response filters) can be used as well.

For example, when an FIR filter is used and the order of transfer function is m+1 (i.e., the number of taps is m+1), if the coefficient of the transfer function (i.e., tap coefficient) is Ck (here, k is a natural number), the relationship between input signal data sequence X(n) and output signal data sequence Y(n) can be expressed by the following equation.

$$Y(n)=C0 \cdot X(n)+C1 \cdot X(n-1)+\ldots+Cm \cdot X(n-m) \quad \text{(Equation 8)}$$

By the way, when there is a difference between the time amplitude signal r(t) takes to reach power amplifying section 17 and the time phase signal φ(t) takes to reach power amplifying section 17, distortion occurs in vector modulation wave Srf(t), which is the output signal of power amplifying section 17. This time difference is caused by, e.g., the difference of delay time in circuits that process an amplitude signal r(t) and a phase signal φ(t).

FIG. 4 is a graph showing frequency spectrum of vector frequency Srf(t) that is the output signal of power amplifying section 17. In the paths through which an amplitude signal r(t) and a phase signal φ(t) reach power amplifying section 17, if there is no difference between delay times, the frequency spectrum shown in FIG. 4A can be acquired, and, if there is a difference between the delay times, a frequency spectrum spread (distortion of modulation wave) occurs as shown in FIG. 4B. In a frequency division multiplex communication system where a plurality of channels are arranged in the frequency domain, this frequency spectrum spread interferes with adjacent channels and therefore is not desirable.

FIG. 5 is a block diagram showing the configuration of transmitting apparatus 40 employs a configuration correcting the difference between the time amplitude signal r(t) takes to reach power amplifying section 17 and the time phase signal φ(t) takes to reach power amplifying section 17, as a second conventional example. This transmitting apparatus 40 of the second conventional example provides shift registers 41, 42, 43 and 44 in the subsequent stage of pulse shaping filters 33 and 34.

Operations of transmitting apparatus 40 of the conventional example will be explained. In addition to the same operations as in transmitting apparatus 30 of the first conventional example shown in FIG. 3, by delaying an IQ signal by given time in shift registers 41 to 44, transmitting apparatus 40 of the conventional example delays an amplitude signal r(t) or a phase signal φ(t) by given time. The delay time is set to the given time by, for example, selecting a given output stage, by a switch from a plurality of connected registers and extracting a signal. Thus, by adjusting the difference between delay times in shift registers 41 and 43 provided on the path to generate an amplitude signal r(t) and the delay time in shift registers 42 and 44 provided on the path to generate a phase signal φ(t), and by reducing the difference between the time amplitude signal r(t) takes to reach power amplifying section 17 and the time phase signal takes to reach power amplifying section 17, it is possible to reduce the distortion of vector modulation wave Srf(t) (e.g., see Patent Document 1).

Patent Document 1: Japanese Patent Application Laid-Open No. Hei 6-54877

DISCLOSURE OF INVENTION

Problems to be Solved by the Invention

However, in transmitting apparatus 40 of the second conventional example shown in FIG. 5, the minimum level of change for changing a delay time, which is equivalent to the resolution of adjusting a delay time, is the delay time per stage in shift registers 41 to 44. This delay time per stage generally corresponds to the sampling period for digital signal processing. Therefore, there is a problem that the delay time adjustment resolution cannot be precise compared to the sampling period of a signal.

The degree where the distortion of vector modulation wave Srf(t) is reduced is decided by the accuracy of adjusting a delay time. Consequently, when the adjustment resolution is limited by the sampling period and insufficient, it is difficult to reduce the distortion of vector modulation wave Srf(t), which is the output of power amplifying section 17, to a sufficiently low level.

In view of the above, it is therefore an object of the present invention to provide a transmitting apparatus that reduces the distortion of a vector modulation wave that is a transmission output to a sufficiently low level.

Means for Solving the Problem

To solve the above problems, the transmitting apparatus of the present invention employs a configuration having: a first pulse generating section that generates an in-phase component pulse signal; a second pulse generating section that generates a quadrature component pulse signal; a first variable coefficient filter that outputs the in-phase component pulse signal as a first in-phase component modulation signal; a second variable coefficient filter that outputs the in-phase component pulse signal as a second in-phase component modulation signal; a third variable coefficient filter that outputs the quadrature component pulse signal as a first quadrature component modulation signal; a fourth variable coefficient filter that outputs the quadrature component pulse signal as a second quadrature component modulation signal; an amplitude signal voltage generating section that generates an amplitude component modulation signal from the first in-phase component modulation signal and the first quadrature component modulation signal; a phase modulation wave generating section that generates a phase modulation wave from the second in-phase component modulation signal and the quadrature component modulation signal; and a power amplifying section that generates a vector modulation wave acquired by amplitude-modulating the phase modulation wave in the amplitude component modulation signal.

With this configuration, transfer function coefficient sequences for first to fourth variable coefficient filters change, so that it is possible to realize the function of a pulse shaping filter by first to fourth variable coefficient filters and adjust the delay time difference between an amplitude component modulation signal and a phase component modulation signal with precise resolution compared to the sampling period in signal processing using the pulse shaping function, thereby reducing the distortion of vector modulation waves to a sufficiently low level.

Further, the transmitting apparatus of the present invention employs a configuration having: a first pulse generating section that generates an in-phase component pulse signal; a second pulse generating section that generates a quadrature component pulse signal; a first pulse shaping filter that receives the in-phase component pulse signal as an input signal; a second pulse shaping filter that receives the quadrature component pulse signal as an input signal; a first variable coefficient filter that receives the in-phase component pulse signal as an input signal; a second variable coefficient filter that receives the quadrature component pulse signal as an input signal; a first addition operation section that adds an output signal of the first pulse shaping filter and an output signal of the first variable coefficient filter and outputs this added signal as a first in-phase component modulation signal; a second addition operation section that adds an output signal of the second pulse shaping filter and an output signal of the second variable coefficient filter and outputs this added signal as a first quadrature component modulation signal; an amplitude signal voltage generating section that generates an amplitude component modulation signal using a combination of the first in-phase component modulation signal and the first orthogonal modulation signal or a combination of an output signal of the first pulse shaping filter and an output signal of the second pulse shaping filter; a phase modulation wave generating section that generates a phase modulation wave using a signal not used in the amplitude signal voltage generating section in the combination of the first in-phase component modulation signal and the first orthogonal modulation signal or the combination of the output signal of the first pulse shaping filter and the output signal of the second pulse shaping filter; and a power amplifying section that generates a vector modulation wave acquired by amplitude-modulating the phase modulation wave in the amplitude component modulation signal.

With this configuration, transfer function coefficient sequences for the first and second variable coefficient filters change, so that it is possible to adjust the delay the time difference between an amplitude component modulation signal and a phase component modulation signal with precise resolution compared to the sampling period in signal processing using the pulse shaping function, thereby reducing the distortion of vector modulation waves to a sufficiently low level. Further, in the first and second variable coefficient filters, the difference component is produced, which is equivalent to delaying a signal, and added to the output signal of the first and second pulse shaping filters, so that it is possible to perform delay adjustment much more accurately or perform delay adjustment with precise resolution compared to the sampling period in signal processing using variable coefficient filters with a much simpler configuration.

Advantageous Effect of the Invention

The present invention enables precise resolution, compared to the sampling period in signal processing, to adjust the delay time difference between an amplitude component modulation signal and a phase component modulation signal in detail, so that it is possible to reduce the distortion of vector modulation waves to a sufficiently low level.

BEST MODE FOR CARRYING OUT THE INVENTION

Embodiments of the present invention will be explained below in detail with the accompanying drawings.

Embodiment 1

Figure 1:
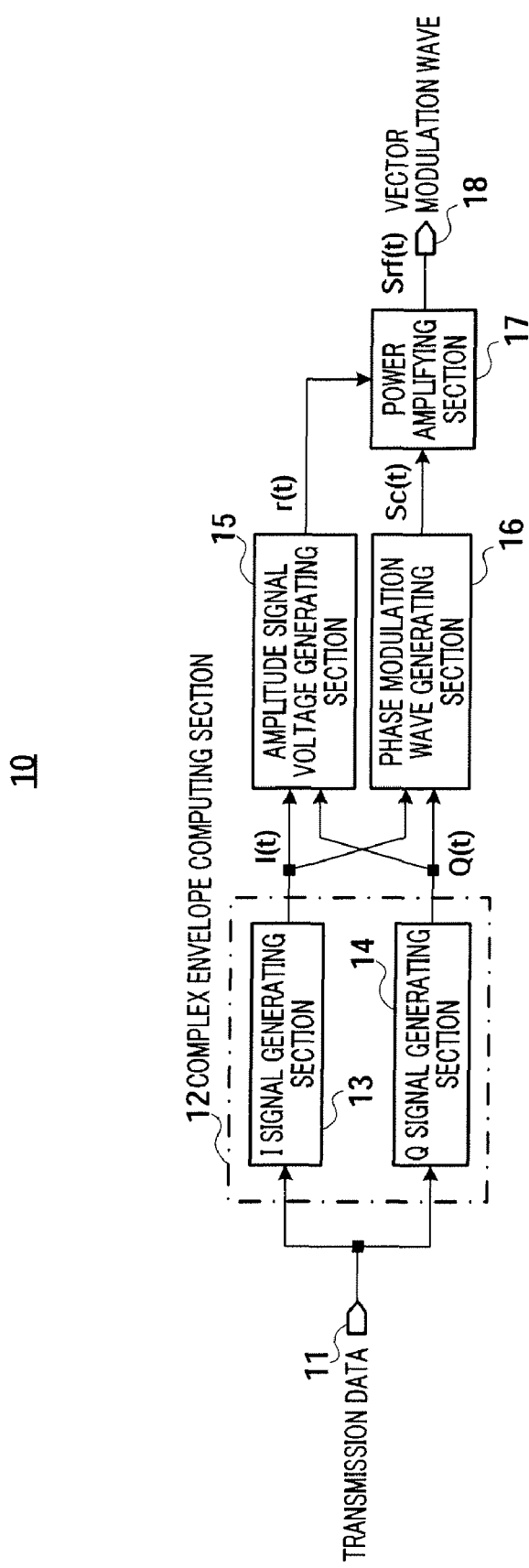
FIG. 1 is a block diagram showing a configuration of a transmitting apparatus of the first conventional example.
Figure 2:
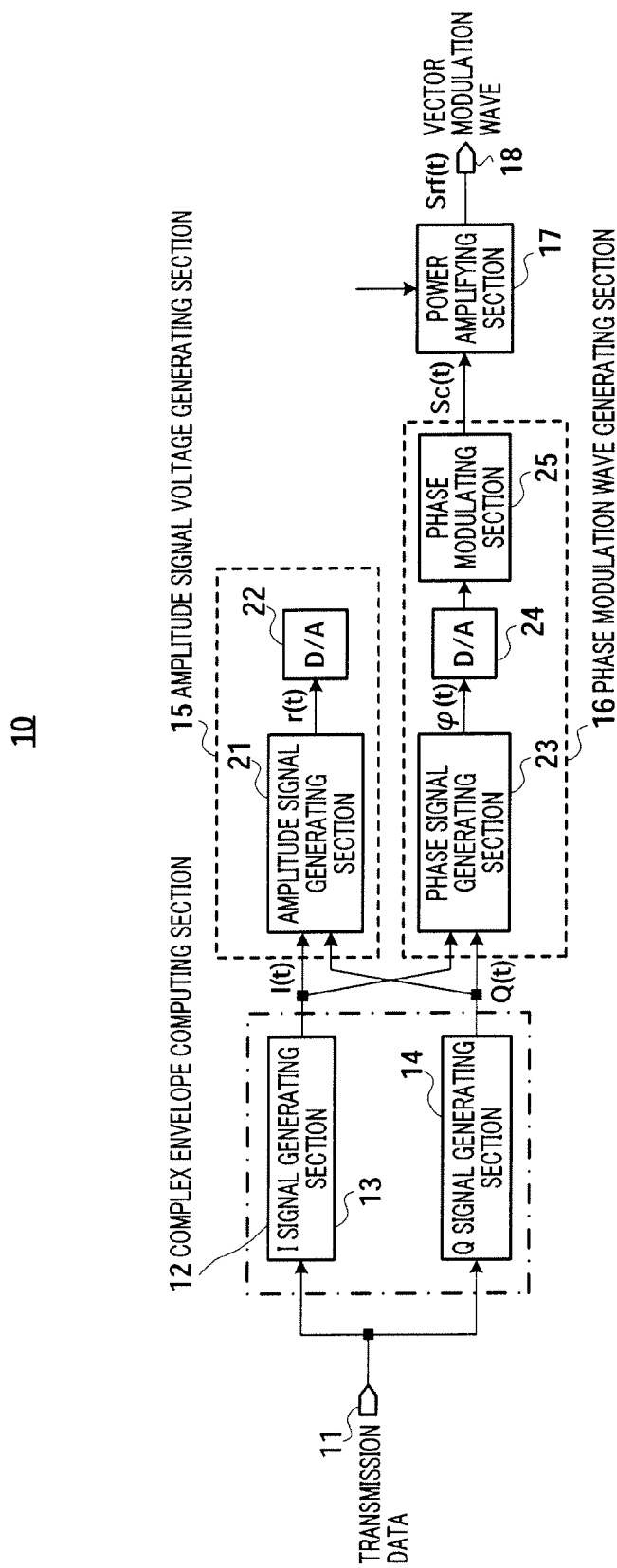
FIG. 2 is a block diagram showing an example of a configuration of the transmitting apparatus of the first conventional example.
Figure 3:
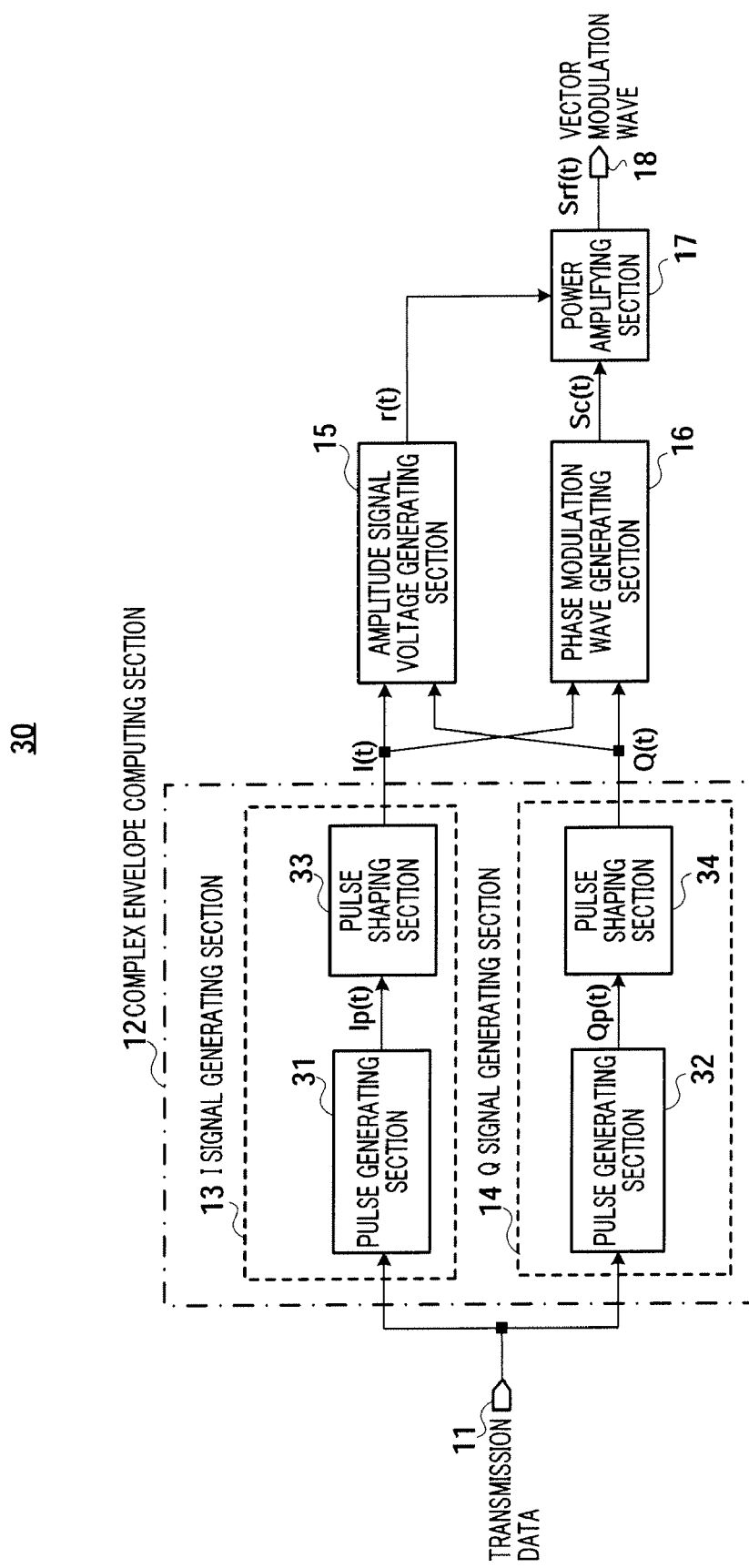
FIG. 3 is a block diagram showing a detailed configuration of the transmitting apparatus of the first conventional example.
Figure 4B:
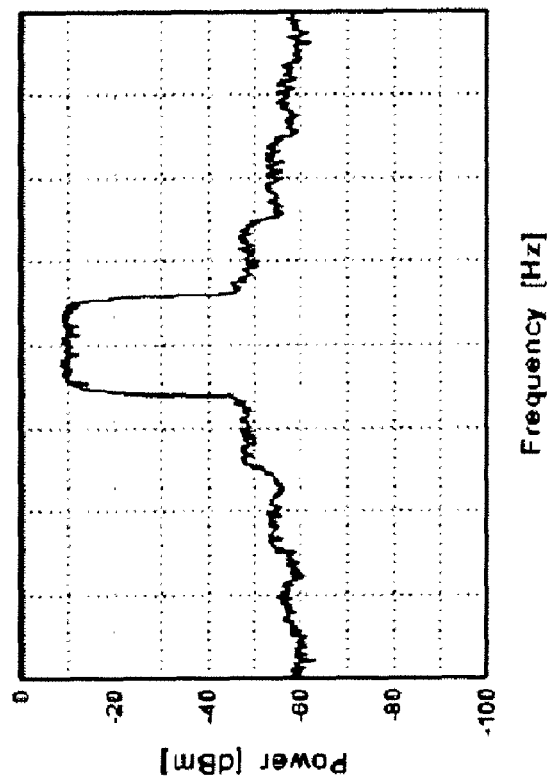
FIG. 4 illustrates a frequency spectrum of vector modulation wave Srf(t)
Figure 4A:
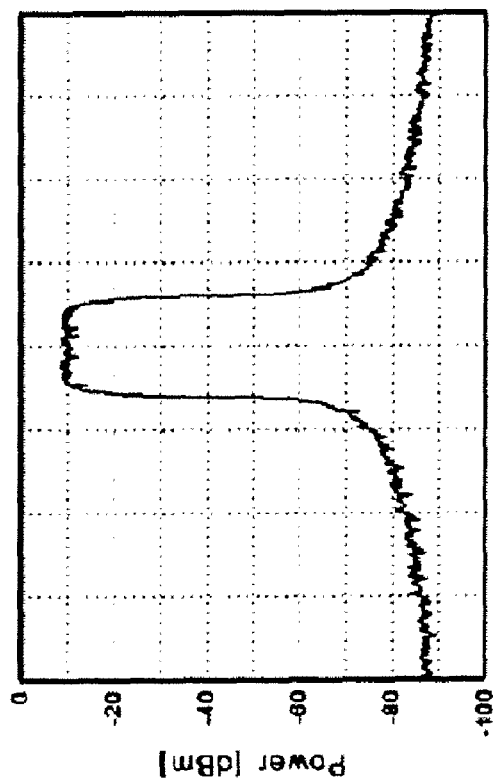
Figure 5:
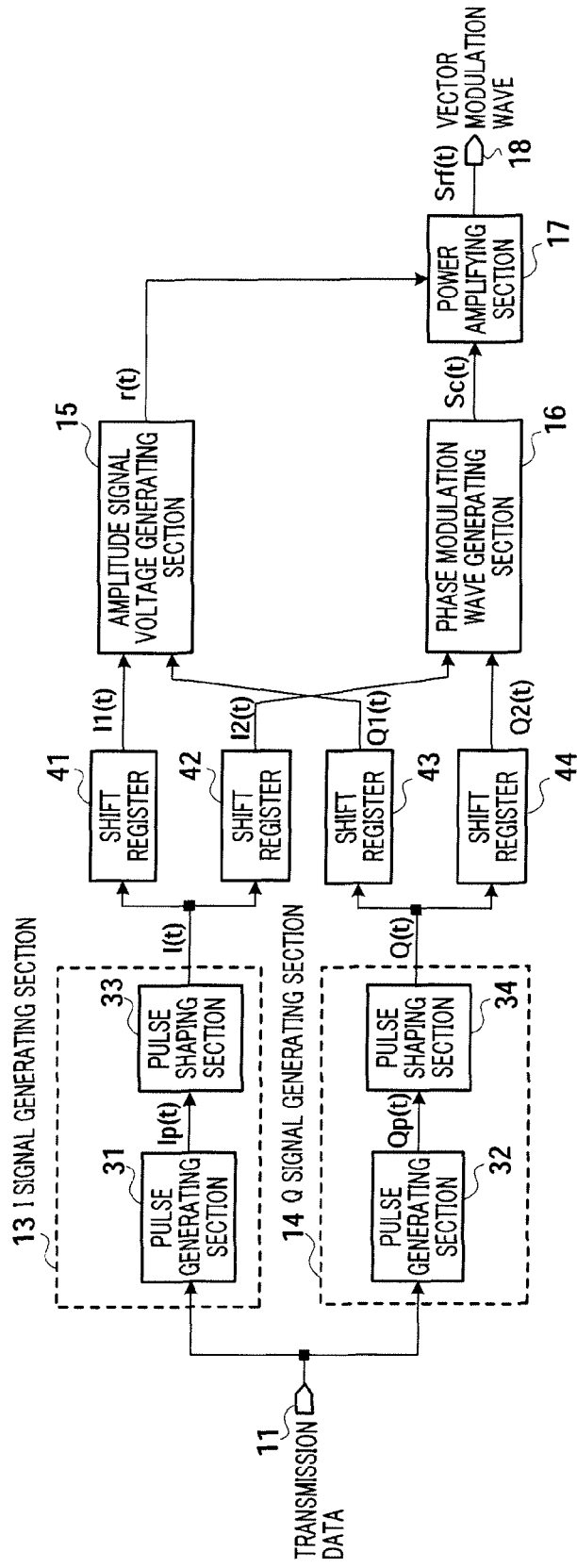
FIG. 5 is a block diagram showing a configuration of a transmitting apparatus of a second conventional example.
Figure 6:
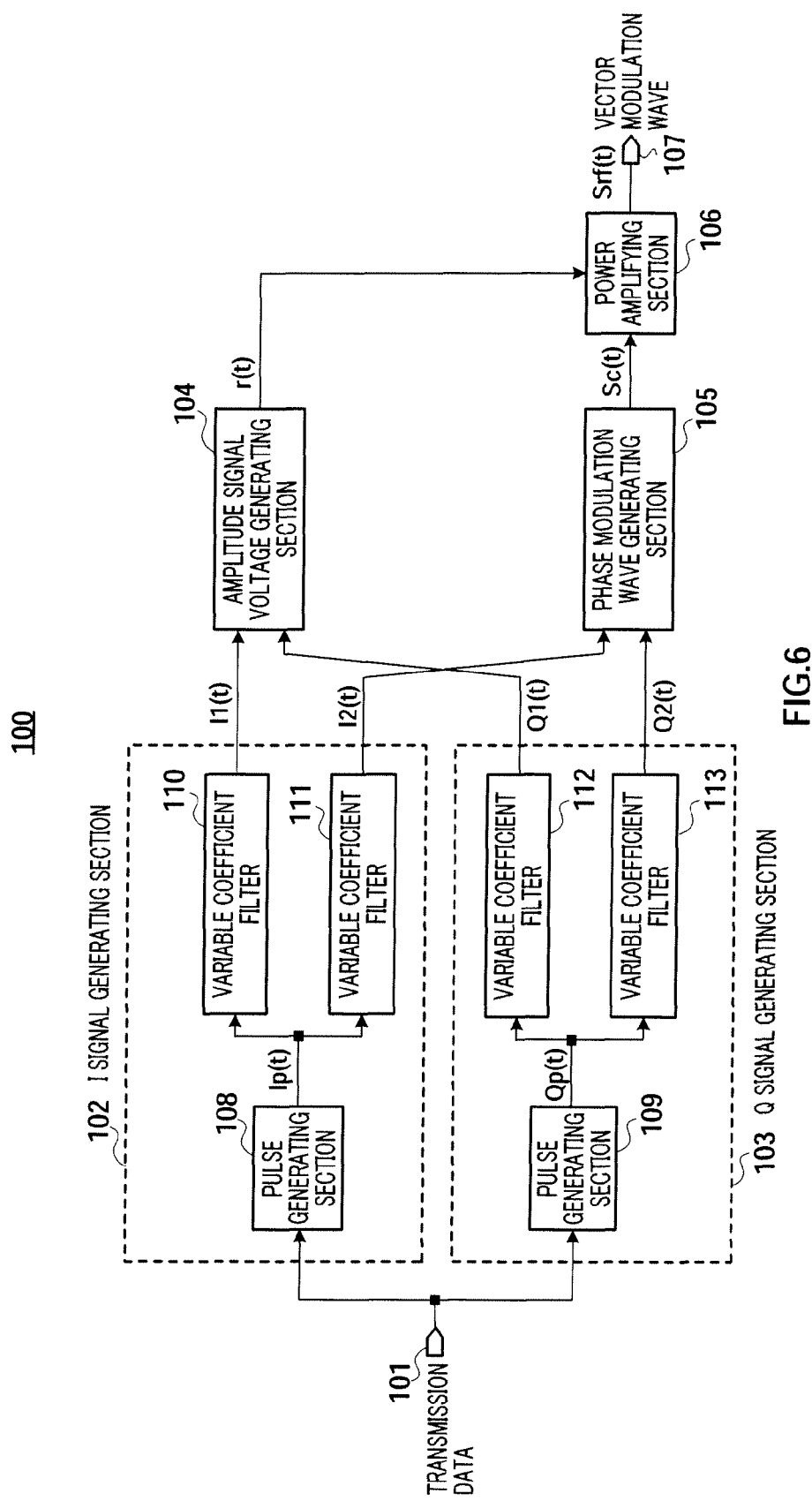
FIG. 6 is a block diagram showing a configuration of a transmitting apparatus according to Embodiment 1 of the present invention.

FIG. 6 illustrates a configuration of the transmitting apparatus according to Embodiment 1 of the present invention.

Transmitting apparatus 100 of the present embodiment is formed with transmission data signal input terminal 101, I signal generating section 102, Q signal generating section 103, amplitude signal voltage generating section 104, phase modulation wave generating section 105, power amplifying section 106 and transmission output terminal 107.

I signal generating section 102 is formed with pulse generating section 108 and variable coefficient filters 110 and 111. Q signal generating section 103 is formed with pulse generating section 109 and variable coefficient filters 112 and 113.

In I signal generating section 102, pulse generating section 108 converts a transmission data signal inputted from transmission data signal input terminal 101 into an I component pulse signal Ip(t) and transmits this I component pulse signal Ip(t) to variable coefficient filters 110 and 111. Output I1(t) of variable coefficient filter 110 is transmitted to amplitude signal voltage generating section 104 and output I2(t) of variable coefficient filter 111 is transmitted to phase modulation wave generating section 105.

In Q signal generating section 103, pulse generating section 109 converts a transmission data signal inputted from transmission data signal input terminal 101 into a Q component pulse signal Qp(t) and transmits this Q component pulse signal Qp(t) to variable coefficient filters 112 and 113. Output Q1(t) of variable coefficient filter 112 is transmitted to amplitude signal voltage generating section 104 and output Q2(t) of variable coefficient filter 113 is transmitted to phase modulation wave generating section 105.

Amplitude signal voltage generating section 104 forms an amplitude component modulation signal r(t) by performing the same processing as in above-described amplitude signal voltage generating section 15 (FIGS. 1 to 3 and FIG. 5) and transmits this to power amplifying section 106. By this means, the power supply voltage of power amplifying section 106 is set based on the amplitude component modulation signal r(t).

Phase modulation wave generating section 105 forms a phase component modulation signal Sc(t) by performing the same processing as in above phase modulation wave generating section 16 (FIGS. 1 to 3 and FIG. 5) and transmits this to power amplifying section 106.

By performing the same processing as in above-described power amplifying section 17 (FIGS. 1 to 3 and FIG. 5), power amplifying section 106 amplifies the signal acquired by multiplying power supply voltage value r(t) of power amplifying section 106 and a phase component modulation signal $S_c(t)$ that is an output signal of phase modulation wave generating section 105, by gain G of power amplifying section 106, and outputs this amplified signal as an RF vector modulation wave Srf(t).

Here, variable coefficient filters 110 to 113 employs a configuration having a pulse shaping filter that cancels intersymbol interference between pulses and performs band-limitation. As an example of a pulse shaping filter, there is a filter with similar gain characteristics to root cosine roll-off characteristics.

Further, variable coefficient filters 110 to 113 employ a configuration that can change the transfer function coefficients. This transfer function is the function that decides the frequency characteristics of a filter. Changing the coefficients of variable coefficient filters 110 to 113 changes frequency characteristics of gain and group delay.

Figure 7B:
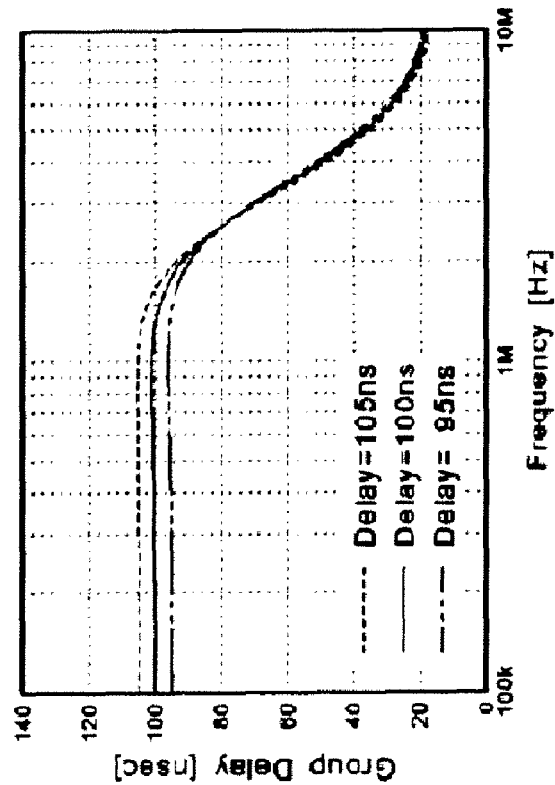
FIG. 7 illustrates frequency characteristics of variable coefficient filter.
Figure 7A:
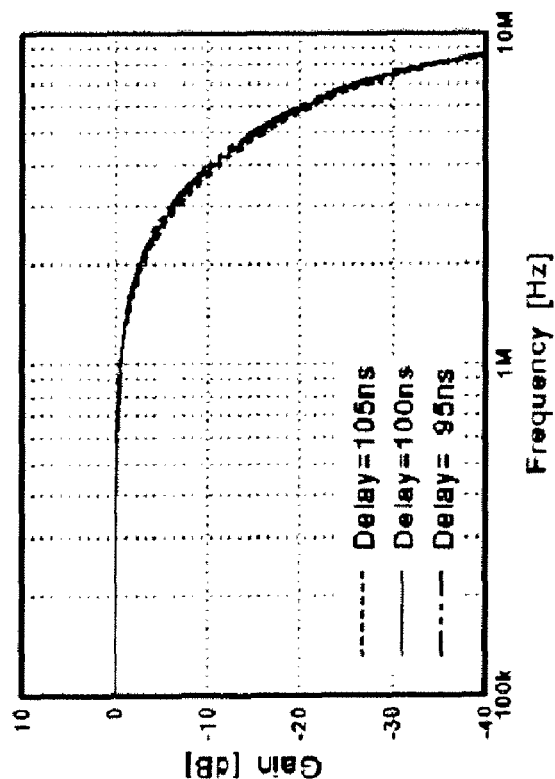

FIG. 7 illustrates an example of the frequency characteristics of variable coefficient filters 110 to 113. This example shows a case where variable coefficient filters 110 to 113 are digital filters and the sampling frequency in digital signal processing is 20 MHz, that is, the sampling period is 50 ns. FIG. 7A illustrates frequency characteristics of gain and FIG. 7B illustrates frequency characteristics of group delay.

By changing the transfer function coefficients in variable coefficient filters 110 to 113, the frequency characteristics change as shown by the solid line, dash line and chain line in FIG. 7. FIG. 7 shows a case of changing transfer function coefficients so as to vary delay times as 95 ns, 100 ns and 105 ns.

In frequency characteristics of group delay shown in FIG. 7B, the group delay shows approximately flat characteristics in the frequency domain in the range of around 2 MHz or less through which a signal passes, so that it is possible to identify the delay times of 95 ns, 100 ns and 105 ns from the group delay values in the domain.

In the examples of FIG. 7, the delay times are changed by 5 ns. As described above, the sampling period is 50 ns, and, consequently, the delay time can be changed with precise resolution with compared to the sampling period.

Further, the gain frequency characteristics shown in FIG. 7A change a little accompanying the change in the delay time. This change of the shape of frequency characteristics changes the shape of the frequency spectrum of a signal that passes the above filters, and, as a result, causes the distortion in vector modulation wave Srf(t) outputted from output terminal 107. However, as shown in FIG. 7A, the change of the shape of gain frequency characteristics accompanying the change in the delay time is little, so that the deterioration of distortion characteristics stays within the allowable range for practical use.

Here, according to the present embodiment, the transfer function coefficient sequence for variable coefficient filter 110 and the transfer function coefficient sequence for variable coefficient filter 112 are set to the same numerical sequence. Further, the transfer function coefficient sequence for variable coefficient filter 111 and the transfer function coefficient sequence for variable coefficient filter 113 are set to the same numerical sequence. Further, the transfer function coefficient sequences for variable coefficient filters 110 and 112 and the transfer function coefficient sequences for variable coefficient filters 111 and 113 are made to change individually. In fact, when a delay difference needs to be adjusted, the transfer function coefficient sequences for variable coefficient filters 110 and 112, and the transfer function coefficient sequences for variable coefficient filters 111 and 113 are set to different numerical values.

Thus, in transmitting apparatus 100, by changing the transfer function coefficients for variable coefficient filters 110 and 112 in the same way as above, it is possible to adjust the delay time of an amplitude component modulation signal r(t). Further, by changing the transfer function coefficients for variable coefficient filters 111 and 113 in the same way as above, it is possible to adjust a delay time of an phase component modulation signal $S_c(t)$. Therefore, by individually changing the coefficients for variable coefficient filters 110 and 112 and the coefficients for variable coefficient filters 111 and 113, it is possible to adjust the delay time difference between the amplitude component modulation signal r(t) and the phase modulation signal $S_c(t)$.

Changing the transfer function coefficient is realized by, for example, storing a plurality of coefficients in a memory and selecting and reading out the coefficient matching a designated delay time. Further, changing the transfer function coefficients can also be realized by calculating and utilizing the coefficient matching the designated delay time by a processor each time.

Next, the operations of transmitting apparatus 100 of the present embodiment will be explained.

In transmitting apparatus 100, when there is a difference between the time required to generate an amplitude component modulation signal r(t) in amplitude signal generating section 104 and the time required to generate a phase component modulation signal Sc(t) in phase modulation wave generating section 105, distortion occurs in vector modulation wave Srt(t) outputted from power amplifying section 106.

Therefore, in transmitting apparatus 100, by adjusting the delay in variable coefficient filters 110 to 113, an amplitude component modulation signal r(t) and a phase component modulation signal Sc(t) without a delay difference are inputted to power amplifying section 106. In fact, the coefficients for variable coefficient filter 110 and variable coefficient filter 112 are set to the same, and the coefficients for variable coefficient filter 111 and variable coefficient filter 113 are set to the same. Further, the coefficients for variable coefficient filters 110 and 112, and the coefficients for variable coefficient filters 111 and 113, are set according to the delay difference of processing between amplitude signal voltage generating section 104 and phase modulation generating section 105. For example, when the processing time in phase modulation wave generating section 105 is longer than the processing time in amplitude signal voltage generating section 104, variable coefficient filters 110 to 113 are set such that output waves of variable coefficient filters 110 and 112 are delayed by the above time difference more than output waves of variable coefficient filters 111 and 113.

Here, these variable filters can precisely form waves compared to the sampling period of a signal, that is, these variable coefficient filters can precisely adjust delay compared to the signal sampling period. Therefore, in transmitting apparatus 100, delay adjustment can be performed at higher accuracy between an amplitude component modulation signal r(t) and a phase component modulation signal $S_c(t)$, so that it is possible to reduce the distortion of vector modulation wave Srf(t) outputted from power amplifying section 106 to a sufficiently low level.

As described above, according to the present embodiment, by providing variable coefficient filters 110 and 112 in the preceding stage to amplitude signal voltage generating section 104, providing variable coefficient filters 111 and 113 in the preceding stage to phase modulation wave generating section 105, and by performing pulse shaping in variable coefficient filters 110 and 113 and performing delay adjustment for an amplitude component modulation signal r(t) and a phase component modulation signal $S_c(t)$, it is possible to adjust the delay time difference between the amplitude component modulation signal r(t) and the phase component modulation signal $S_c(t)$ with precise resolution compared to the sampling period in signal processing. As a result, it is possible to reduce the distortion of vector modulation wave Srf(t) to a sufficiently low level.

Embodiment 2

Figure 8:
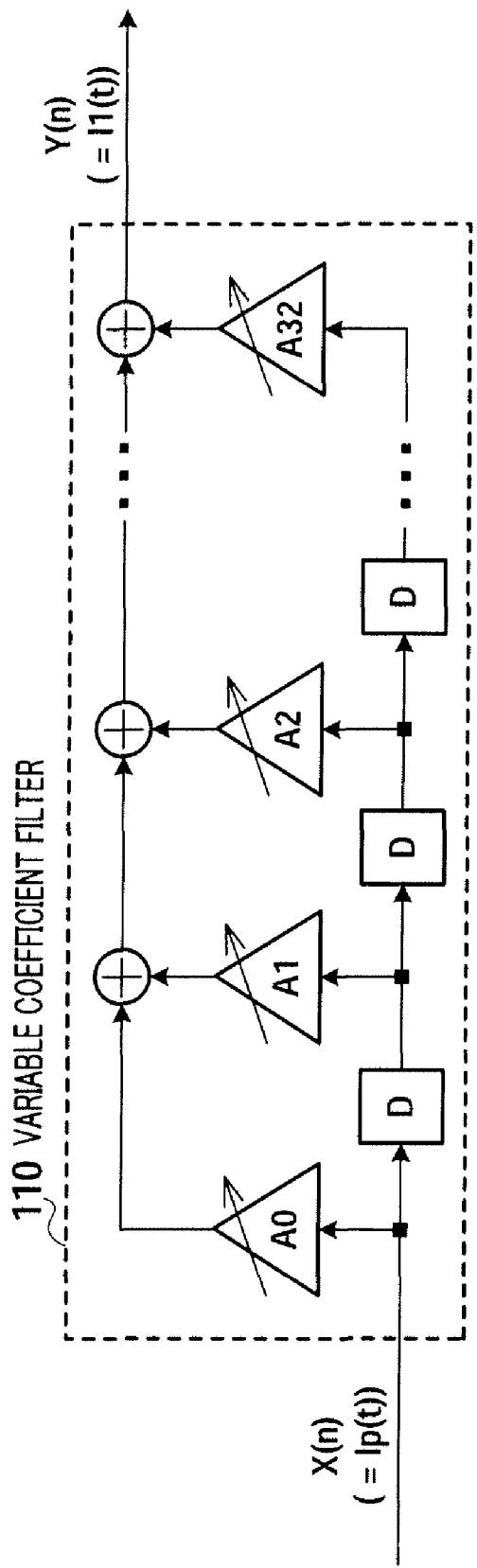
FIG. 8 is a block diagram showing a configuration of a variable coefficient filter according to Embodiment 2 of the present invention.

The present embodiment suggests using the FIR (Finite Impulse Response) filter shown in FIG. 8 for variable coefficient filters 110 to 113 explained in Embodiment 1. Further, although FIG. 8 illustrates the configuration of variable coefficient filter 110, the configurations of variable coefficient filters 111, 112 and 113 are the same as in FIG. 8.

In FIG. 8, the transfer function coefficient, that is, the tap coefficient is Ak (k is a natural number). A tap coefficient sequence matches the data sequence of an impulse response waveform expressed in the discrete time. That is, the tap coefficient sequence is numerical values of the impulse response waveform expressed in the continuous time.

As an example, FIG. 8 illustrates a configuration where the order of a transfer function, that is, the number of taps, is 33. In this case, the relationship between input signal data sequence X(n) and output signal data sequence Y(n) is expressed by the following equation.

$$Y(n)=A0 \cdot X(n)+A1 \cdot X(n-1)+ \ldots +A32 \cdot X(n-32) \quad \text{(Equation 9)}$$

Figure 9A:
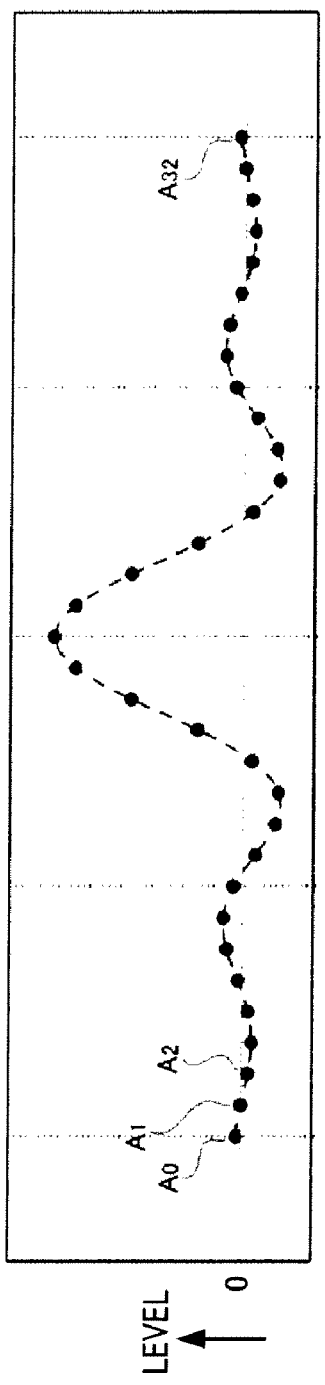
FIG. 9 illustrates an example of a method of deciding tap coefficient Ak.
Figure 9B:
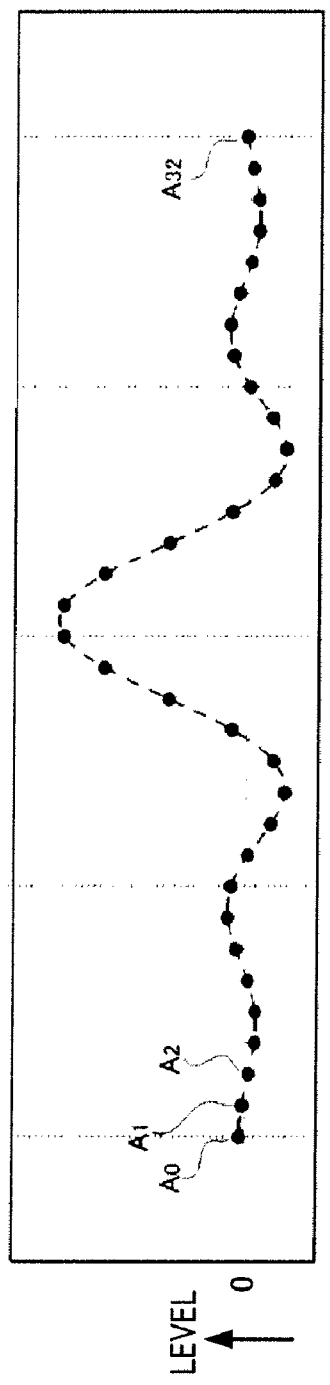

FIG. 9 is a schematic view illustrating a state where impulse response waveforms are sampled to acquire the value of tap coefficient Ak. FIGS. 9A and 9B show the method of determining tap coefficient Ak for changing delay time.

In FIG. 9A, the impulse response waveform shown by the dash line is sampled at a regular period and is data sequences shown with dots. Further, the value of each data at vertical axis shown with dots is set as tap coefficient Ak in the FIR filter. The sampling period upon this sampling matches the sampling period in digital signal processing in the FIR filter.

On the other hand, in FIG. 9B, the impulse response waveform shown by the dash line is sampled at a regular period and is set as tap coefficient An in the FIR filter. However, compared to FIG. 9A, although the impulse response waveform shown by the dash line is the same in the form, the impulse response waveform is different in shifting in the time domain. This shows that the same impulse response waveform is sampled at different sampling timings, that is, the same impulse response waveform is sampled in different sampling phases.

Therefore, the values of tap coefficient Ak are different between FIG. 9A and FIG. 9B. However, the original impulse response waveforms shown by the dash line are the same, that is, although there is no essential difference between the pass characteristics of a signal, there is a difference in shifts in the time domain, that is, there is a difference in delay time. Therefore, by using the FIR filter, it is possible to change delay time alone without changing the gain frequency characteristics.

As shown in FIG. 9B, compared to FIG. 9A, the delay time in the FIR filter where tap coefficient Ak acquired by sampling is set as shown in FIG. 9B, is half the sampling period, that is, the delay time is half the sampling period in signal processing. That is, upon changing the tap coefficient, by using the tap coefficient acquired by the above method, it is possible to change the delay time with precise resolution compared to the sampling period in signal processing.

For ease of explanation, although an example has been described in FIG. 9 where the resolution for adjusting delay time is half the sampling period, it is possible to adjust resolution more precisely depending on a method of selecting a sampling phase to acquire tap coefficients.

Here, for example, when the processing time in phase modulation wave generating section 105 is longer than the processing time in amplitude signal voltage generating section 104 by half the sampling period, tap coefficients A0 to A32 in variable coefficient filters 110 and 112 employing a configuration of the FIR filter may be set as shown in FIG. 9B, and tap coefficients A0 to A32 in variable coefficient filters 111 and 113 employing a configuration of the FIR filter may be set as shown in FIG. 9A.

Further, changing tap coefficients is realized by, for example, storing a plurality of tap coefficients in a memory and selecting and reading out the coefficient matching the designated delay time. Further, changing tap coefficients can also be realized by calculating and utilizing the coefficient matching the designated delay time by a processor each time.

As described above, according to the present embodiment, by using an FIR filter as variable coefficient filters 110 to 113, it is possible to adjust the delay time difference between an amplitude component modulation signal r(t) and a phase component modulation signal $S_c(t)$ with precise resolution compared to the sampling period in signal processing. As a result, it is possible to reduce the distortion of vector modulation wave Srt(t) to a sufficiently low level.

Embodiment 3

Figure 10:
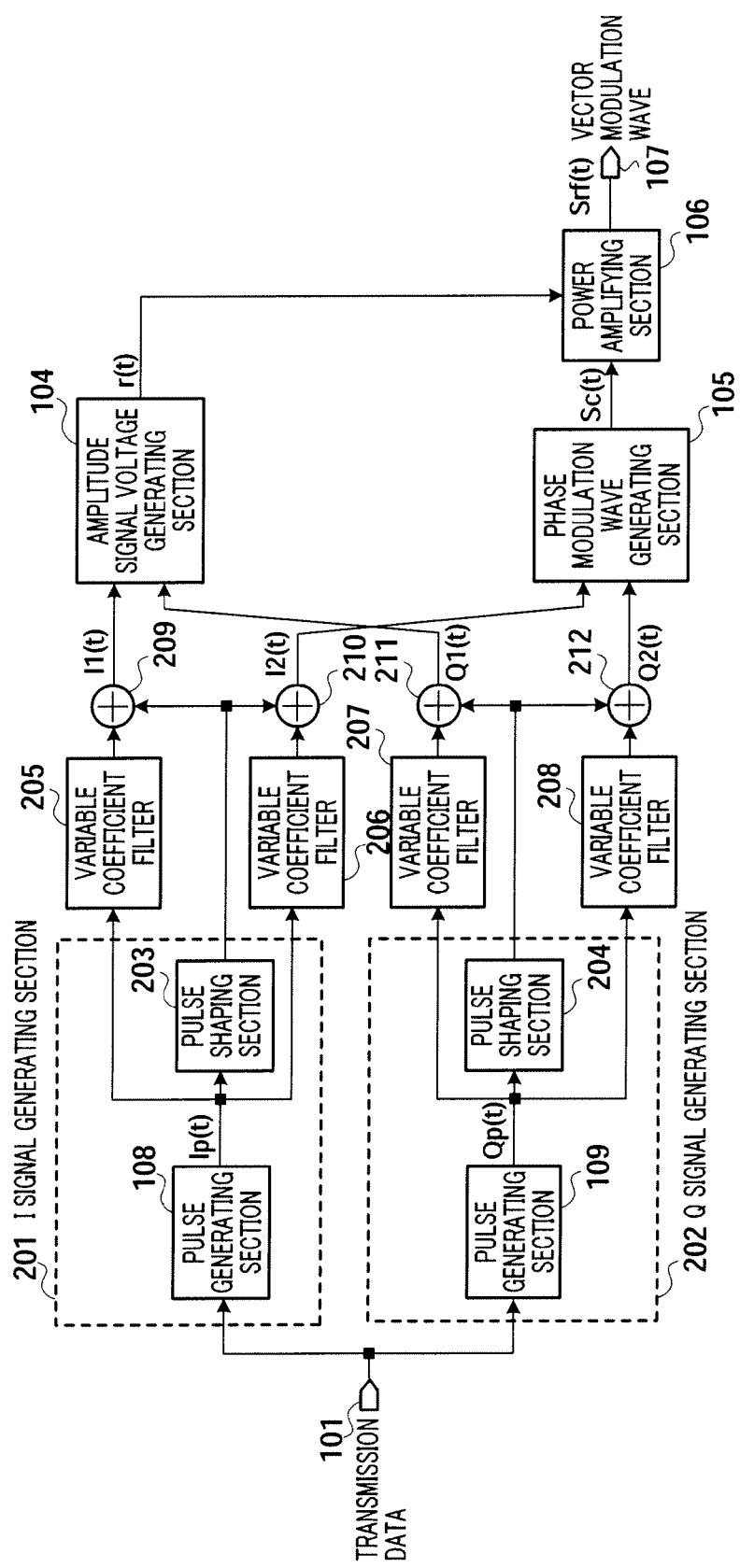
FIG. 10 is a block diagram showing a configuration of a transmitting apparatus according to Embodiment 3 of the present invention.

FIG. 10 has the same components shown in FIG. 6 and assigned the same numerical numbers as in FIG. 6, and illustrates a configuration of the transmitting apparatus of the present embodiment.

I signal generating section 201 of the transmitting apparatus 200 is formed with pulse generating section 108 and pulse shaping filter 203. Similarly, Q signal generating section 202 is formed with pulse generating section 109 and pulse shaping filter 204. Further, in transmitting apparatus 200, variable coefficient filters 205 and 207 are provided in the preceding stage to amplitude signal voltage generating section 104 and variable coefficient filters 206 and 208 are provided in the preceding stage to phase modulation wave generating section 105.

In transmitting apparatus 200, the output of pulse shaping filter 203 and the output of variable coefficient filter 205 are summed up in addition operation section 209 and inputted to amplitude signal voltage generating section 104, and the output of pulse shaping filter 204 and the output of variable coefficient filter 207 are summed up in addition operation section 211 and inputted to amplitude signal voltage generating section 104. Further, in transmitting apparatus 200, the output of pulse shaping filter 203 and the output of variable coefficient filter 206 are summed up in addition operation section 210 and inputted to phase modulation wave generating section 105, and the output of pulse shaping filter 204 and the output of variable coefficient filter 208 are summed up in addition operation section 212 and inputted to phase modulation wave generating section 105.

Here, compared to transmitting apparatus 100 of FIG. 6, transmitting apparatus 200 of the present embodiment employs a configuration further having pulse shaping filters 203 and 204 and addition operation sections 209 to 212. By adding these components, in transmitting apparatus 200, compared to variable coefficient filters 110 to 113 (FIG. 6), the pulse shaping filter functions are removed from variable coefficient filters 205 to 208.

Figure 11:
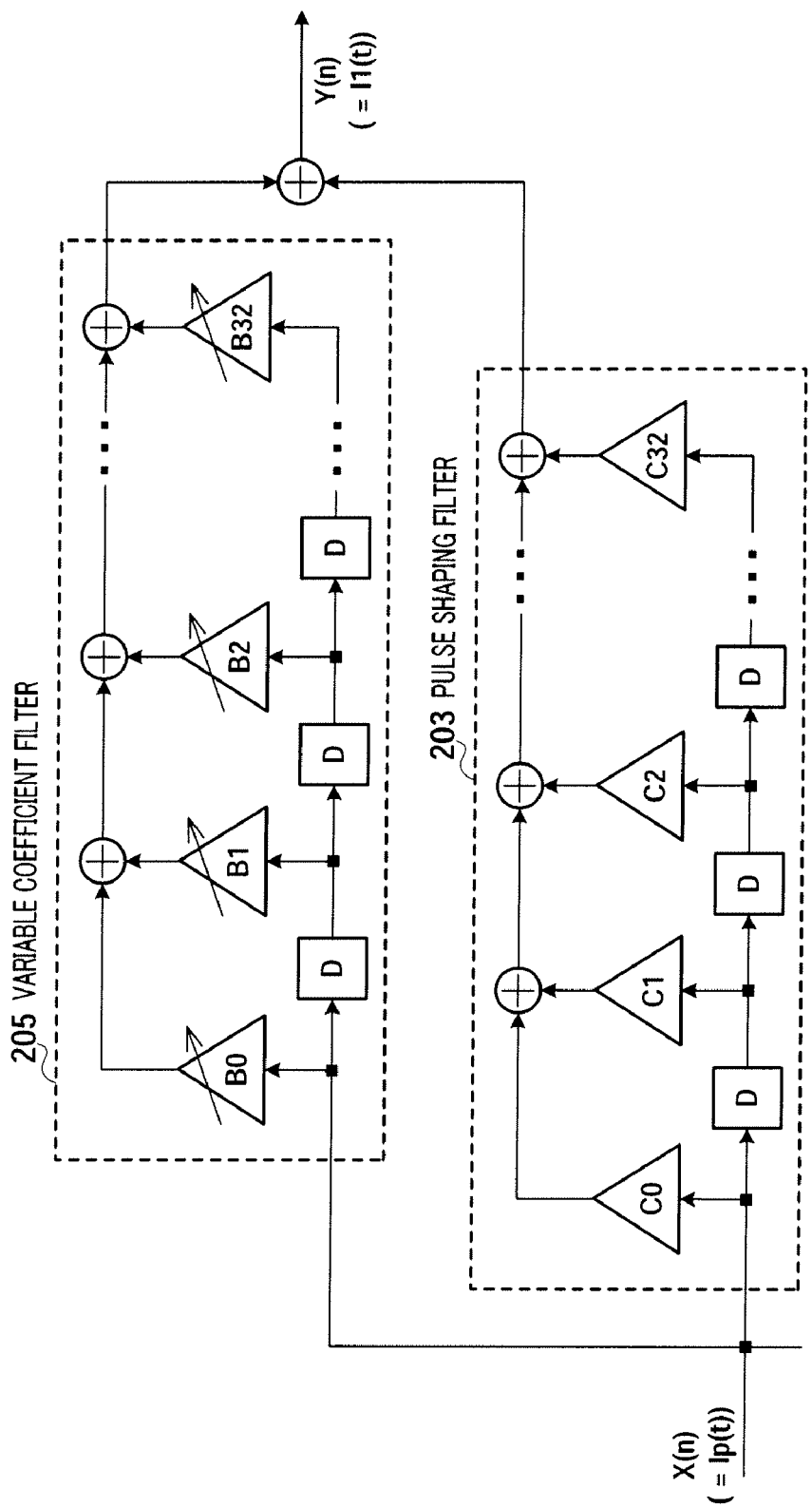
FIG. 11 is a block diagram showing a configuration of pulse shaping filter and variable coefficient filter according to Embodiment 3.

FIG. 11 illustrates the configuration of pulse shape filter 203 and variable coefficient filter 205. Further, the configuration of pulse shape filter 204 and variable coefficient filters 206, 207 and 208 will be the same as in FIG. 11.

Pulse shaping filters 203 and 204 are FIR filters and have tap coefficient Ck (k is a natural number). Variable coefficient filters 205 to 208 are FIR filters and have tap coefficient Bk (k is a natural number).

FIG. 11 illustrates an example of a configuration where the number of taps is 33. In this case, the relationship between input signal data sequence X(n) and output signal data sequence Y(n) is expressed by the following equation.

$$Y(n)=B0 \cdot X(n)+B1 \cdot X(n-1)+\ldots+B32 \cdot X(n-32)+C0 \cdot X(n)+C1 \cdot X(n-1)+\ldots+C32 \cdot X(n-32) \quad \text{(Equation 10)}$$

When the right side of equation 10 is expanded, the following equation is acquired.

$$(B0+C0) \cdot X(n)+(B1+C1) \cdot X(n-1)+\ldots+(B32+C32) \cdot X(n-32) \quad \text{(Equation 11)}$$

When equation 11 is compared to equation 9 explained in Embodiment 2, if the following equation is established, the transfer characteristics are the same.

$$Ak=Bk+Ck \quad \text{(Equation 12)}$$

Equation 12 can be changed into the following equation.

$$Bk=Ak-Ck \quad \text{(Equation 13)}$$

The same coefficient as in a conventional pulse shaping filter may be set as the coefficient in pulse shaping filters 203 and 204. That is, coefficients such as tap coefficient Ck (k is a natural number) explained using equation 8 as a conventional example, may be set.

Further, Ak (k is a natural number) is the tap coefficient for variable coefficient filters 110, 111, 112 and 113 explained in Embodiment 2.

Therefore, according to the present embodiment, as shown in equation 13, the difference is calculated between the value of Ak determined in accordance with the desirable delay time and the value of tap coefficient Ck for pulse shaping filters 203 and 204, and this calculated difference is set as tap coefficient Bk for variable coefficient filters 205, 206, 207 and 208.

Here, in transmitting apparatus 200, by changing the tap coefficient for variable coefficient filters 205 and 207 in the same way as above, the delay time for an amplitude component modulation signal r(t) is adjusted. Further, by changing the tap coefficient for variable coefficient filters 206 and 208, the delay time for a phase component modulation signal $S_c(t)$ is adjusted. Further, by changing the tap coefficient for variable coefficient filters 205 and 207 and the tap coefficient for variable coefficient filters 206 and 208 individually, the delay time difference between the amplitude component modulation signal r(t) and the phase component modulation signal Sc(t). In fact, when a delay difference needs to be adjusted, the tap coefficients for variable coefficient filters 205 and 207 and the tap coefficients for variable coefficient filters 206 and 208 are set to be different.

Changing a tap coefficient is realized by, for example, storing a plurality of tap coefficients in a memory and selecting and reading out the coefficient matching a designated delay time. Further, changing a tap coefficient can also be realized by calculating and utilizing the coefficient matching the designated delay time by the processor each time.

Figure 12A:
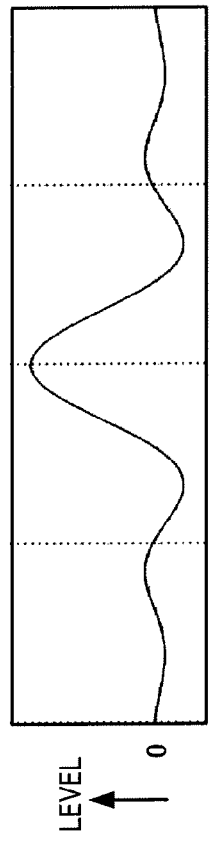
FIG. 12 illustrates an output waveform of pulse shape, variable coefficient filter and addition operation section.
Figure 12B:
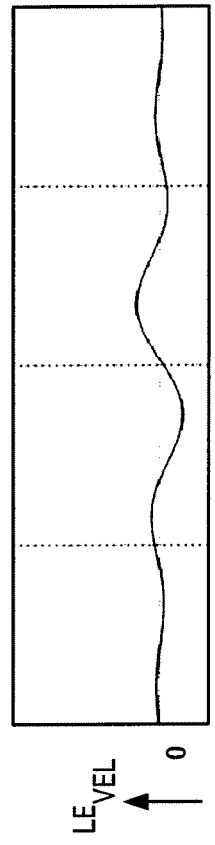
Figure 12C:
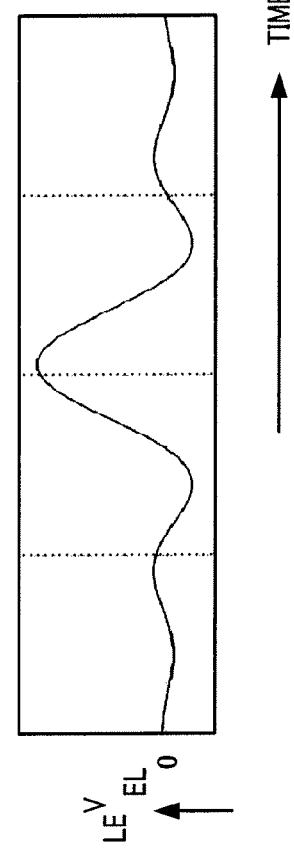

Next, FIG. 12A illustrates an output waveform in pulse shaping filter 203, FIG. 12B illustrates an output waveform in variable coefficient filter 205 and FIG. 12C illustrates an output waveform in addition operation section 209. Here, an output waveform in pulse shaping filter 204 is the same as in FIG. 12A, an output waveform in variable coefficient filter 207 is the same as in FIG. 12B and an output waveform in addition operation section 211 is the same as in FIG. 12C. Further, output waveforms in variable coefficient filters 206 and 208 are acquired by changing the waveform in FIG. 12B by the delay time, and output waveforms in addition operation sections 211 and 212 are acquired by shifting the waveform in FIG. 12C by the delay time in the time domain.

With the above present embodiment, by adjusting the delay between an amplitude component modulation signal r(t) and a phase modulation signal $S_c(t)$ using pulse shaping filters 203 and 204 and variable coefficient filters 205 to 208, compared to a case where delay adjustment is performed using variable coefficient filters 110 to 113 alone as shown in Embodiment 1, by leaving pulse shaping processing to pulse shaping filters 203 and 204, (i.e., by producing a component of the difference alone in variable coefficient filters 205 to 208, which is equivalent to delaying a signal), variable coefficient filters 205 to 208 can perform delay adjustment much more accurately than with Embodiment 1 or perform delay adjustment equivalent to the delay adjustment in Embodiment 1 with a much simpler configuration than with Embodiment 1.

That is, as shown in FIG. 12B, with the present embodiment, by leaving pulse shaping processing to pulse shaping filters 203 and 204, the output level of variable coefficient filters 205 to 208 becomes low. Therefore, if the number of bits of tap coefficients is the same between variable coefficient filters 205 to 208, it is possible to improve the accuracy at the level axis. By contrast, if the accuracy at the level axis needs not be improved, the number of bits of tap coefficients can be reduced, so that it is possible to simplify the configuration.

Here, as pulse shaping filters 203 and 204, an existing pulse shaping filter can be used, so that costs will not increase for new development, designing and production. That is, delay time adjustment can be realized with good characteristics using a pulse shaping filter mounted on a conventional transmitting apparatus as a fixed coefficient filter. Here, although pulse shaping filters 203 and 204 are sufficient to be filters with fixed coefficients, pulse shaping filters 203 and 204 may be filters with variable coefficients.

As described above, according to the present embodiment, by providing pulse shaping filters 203 and 204 and variable coefficient filters 205 to 208, and by producing a component of the difference alone in variable coefficient filters 205 to 208, which is equivalent to delaying a signal, and adding the signal to an output signal of pulse shaping filters 203 and 204, in addition to the advantageous of Embodiments 1 and 2, it is possible to perform delay adjustment much more accurately than with Embodiments 1 and 2 or perform delay adjustment equivalent to the delay adjustment in Embodiments 1 and 2 with a much simpler configuration than with Embodiments 1 and 2.

Further, in the configuration of FIG. 10, although both advancing and delaying an amplitude component modulation signal r(f) and advancing and delaying a phase component modulation signal Sc(t) are possible, to adjust the delay time difference between the amplitude component and the phase component, advancing and delaying one of these components alone needs to be performed. Therefore, the variable coefficient filters that process one of the amplitude component and the phase component can be replaced with the fixed coefficient filters.

Figure 13:
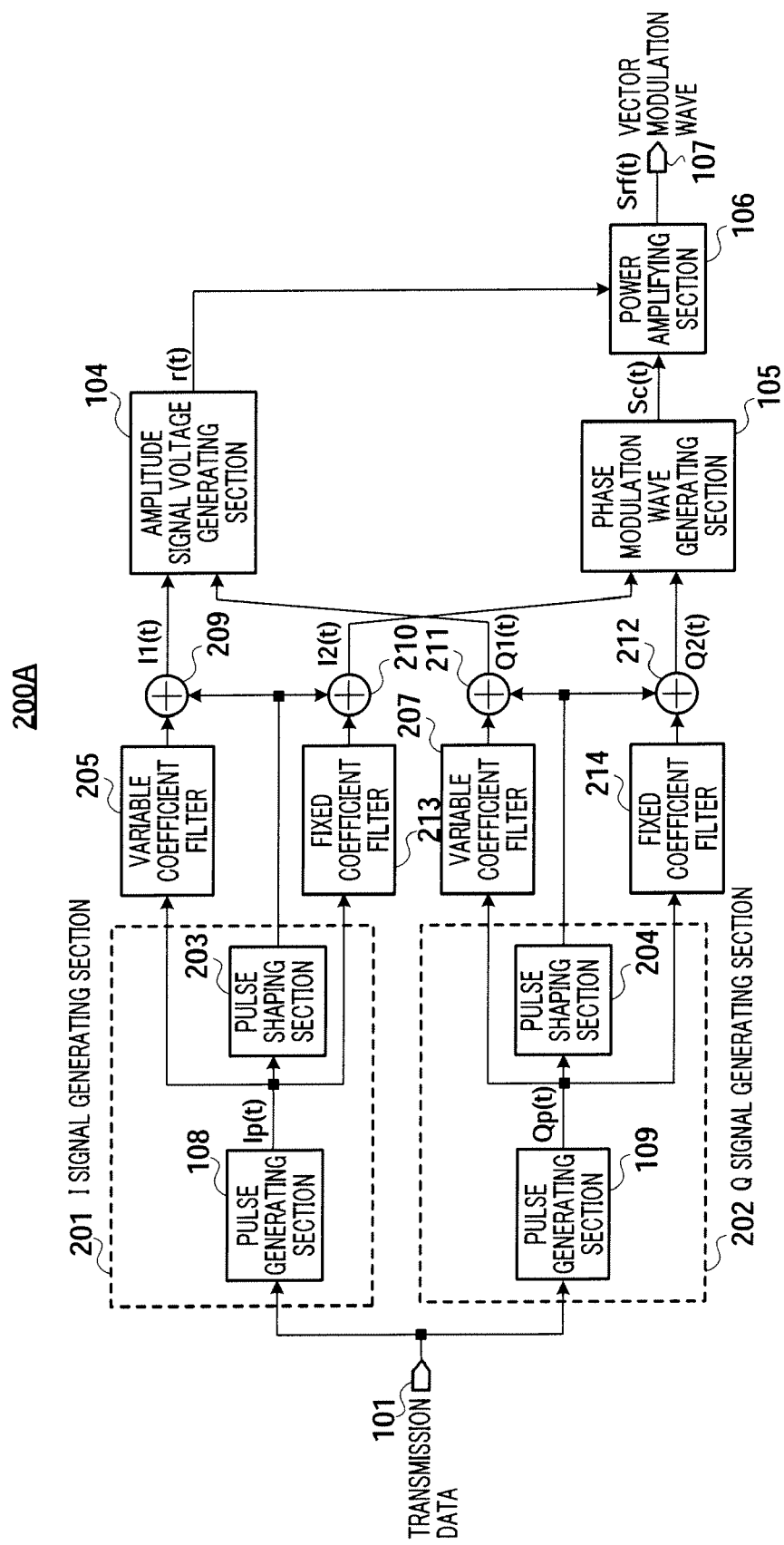
FIG. 13 is a block diagram showing a configuration of a transmitting apparatus according to Embodiment 3 of the present invention.
Figure 14:
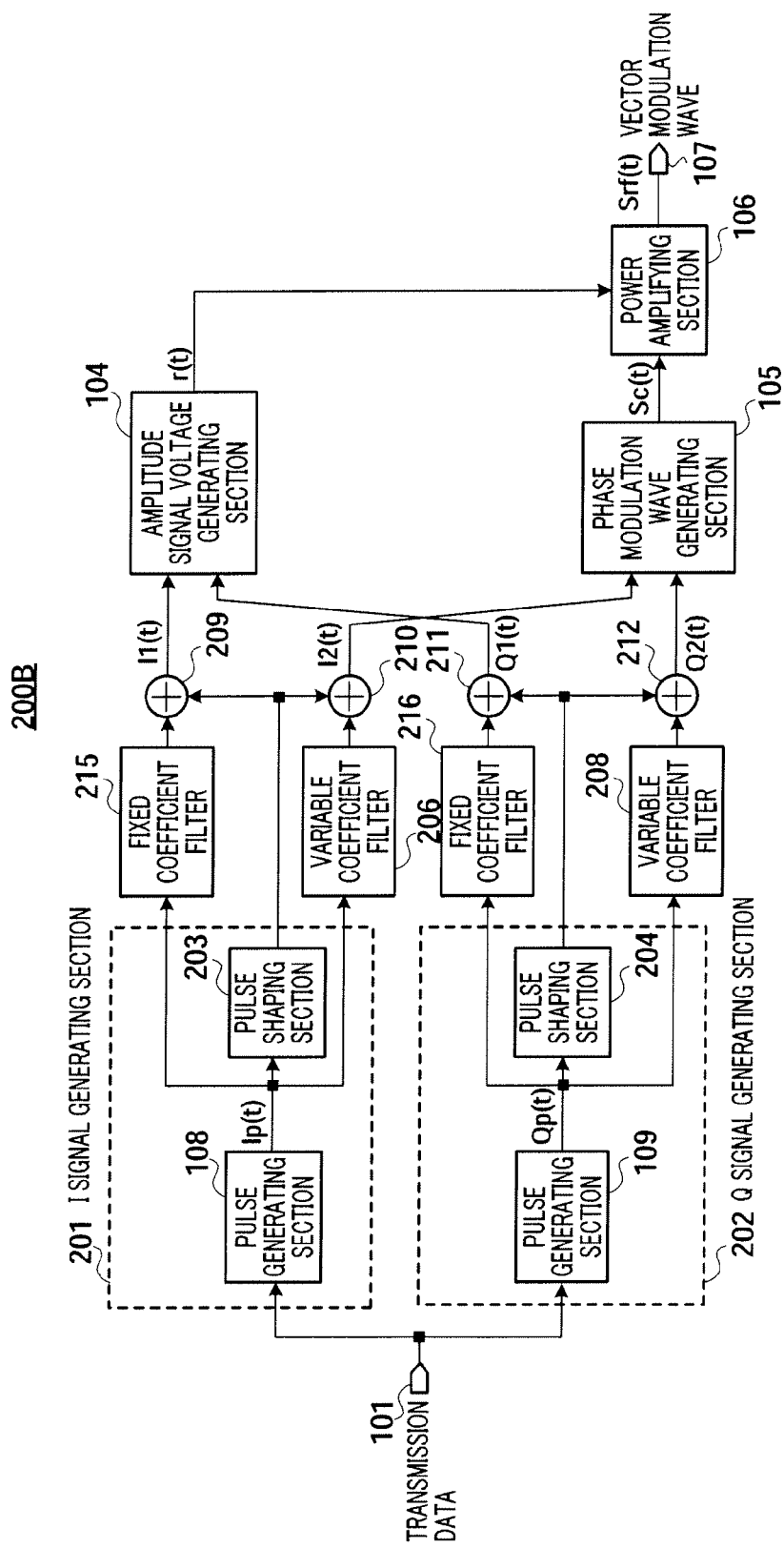
FIG. 14 is a block diagram showing a configuration of a transmitting apparatus according to Embodiment 3 of the present invention.

For example, FIGS. 13 and 14 illustrate other configurations of the transmitting apparatus according to the present embodiment. Transmitting apparatus 200A of FIG. 13 shows an example where variable coefficient filters 206 and 208 of FIG. 10 are replaced with fixed coefficient filters 213 and 214 so that an amplitude component modulation signal r(t) alone can be advanced and delayed. Transmitting apparatus 200B of FIG. 14 shows an example where variable coefficient filters 205 and 207 of FIG. 10 are replaced with fixed coefficient filters 215 and 216 so that a phase component modulation signal Sc(t) alone can be advanced and delayed. Generally, compared to providing a variable coefficient filter, a fixed coefficient filter can be provided with fewer devices, so that it is possible to reduce the circuit scale and power consumption.

Figure 15:
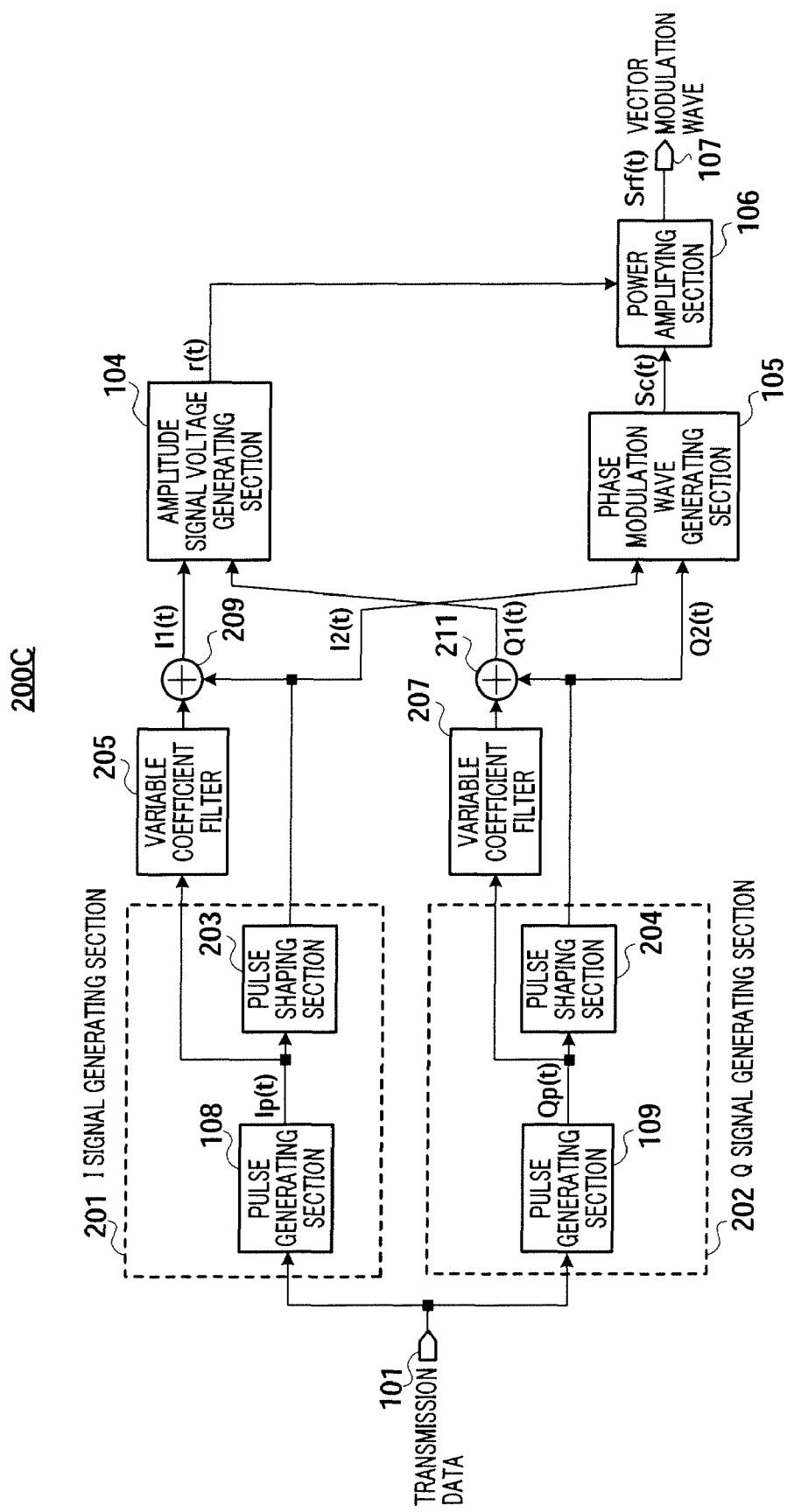
FIG. 15 is a block diagram showing a configuration of a transmitting apparatus according to Embodiment 3 of the present invention.
Figure 16:
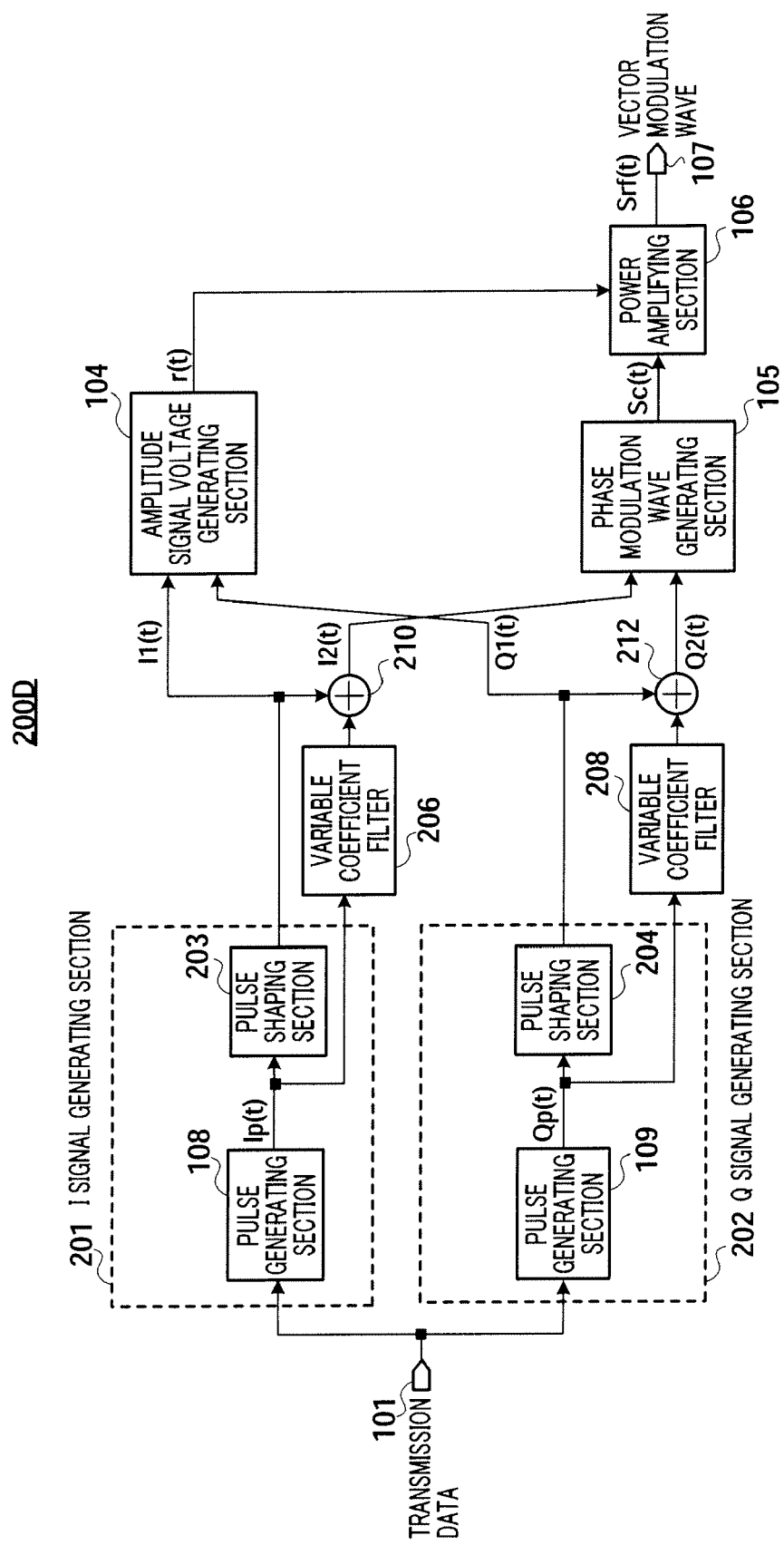
FIG. 16 is a block diagram showing a configuration of a transmitting apparatus according to Embodiment 3 of the present invention.

Further, FIGS. 15 and 16 illustrate other configurations of the transmitting apparatus according to the present embodiment. Transmitting apparatus 200C of FIG. 15 shows an example where fixed coefficient filters 213 and 214 and addition operation sections 210 and 212 of FIG. 13 are removed so that an amplitude component modulation signal r(t) alone can be advanced and delayed. Transmitting apparatus 200D of FIG. 16 shows an example where fixed coefficient filters 215 and 216 and addition operation sections 209 and 211 of FIG. 14 are removed so that a phase component modulation signal Sc(t) alone can be advanced and delayed. By removing fixed coefficient filters, it is possible to further reduce the circuit scale and power consumption.

Other Embodiments

Figure 17:
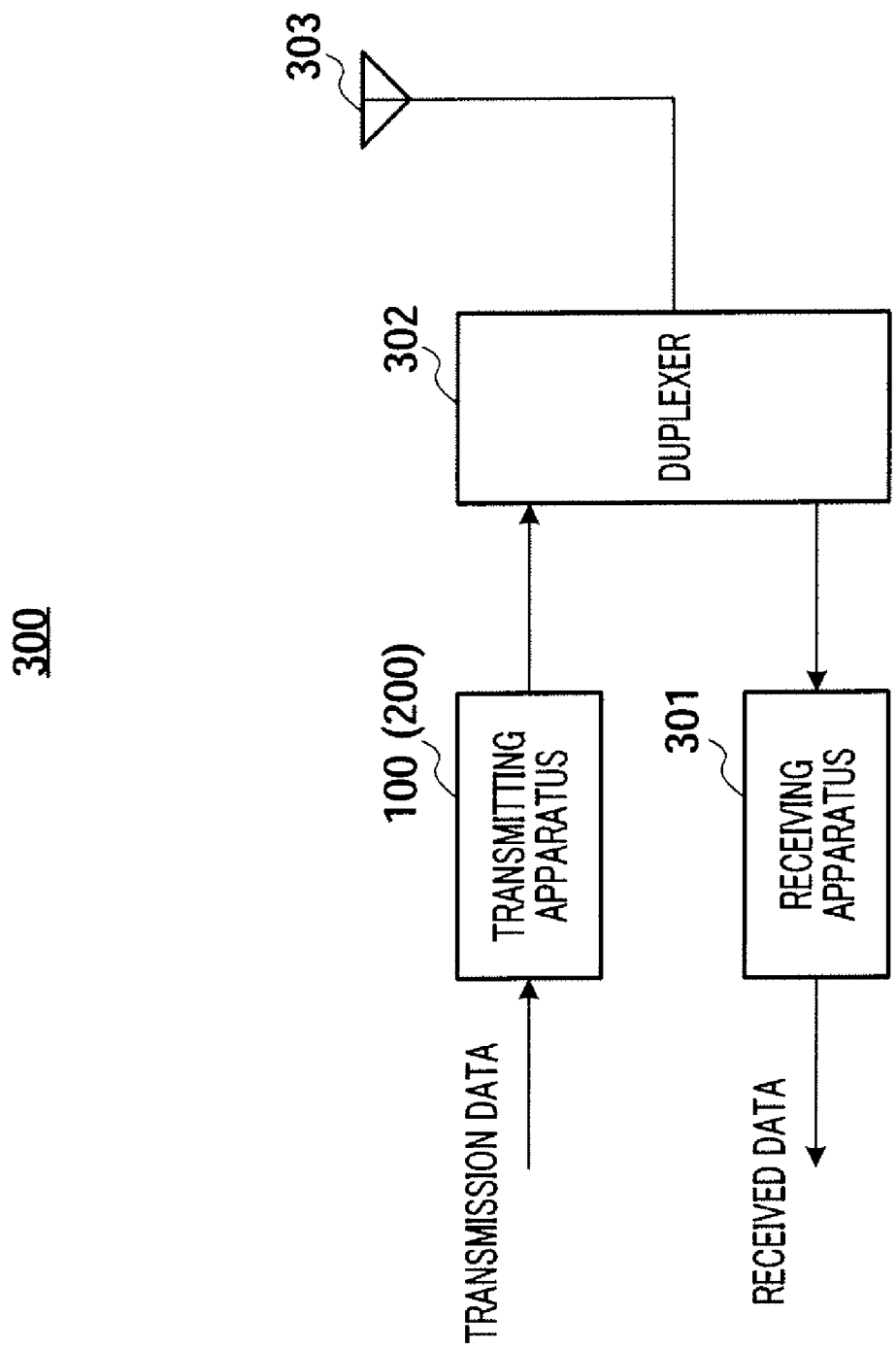
FIG. 17 is a block diagram showing a configuration of a wireless communicator provided with a transmitting apparatus of the present invention.

FIG. 17 illustrates a schematic configuration of a radio communication device employing transmitting apparatus 100 (200) according to Embodiments 1 to 3. Radio communication device 300 is formed with transmitting apparatus 100 (200) according to one of Embodiments 1 to 3, receiving apparatus 301 that acquires received data by performing predetermined reception processing including demodulation processing on a received signal, duplexer 302 that switches a transmission signal and received signal, and antenna 303.

By this means, radio communicator 300 employs a configuration having the transmitting apparatus of the present invention, and, consequently, can transmit the RF vector modulation wave with less distortion. As a result, for example, if radio communicator 300 is a mobile terminal, it is possible to realize a mobile terminal that can be used for a long time and transmit a high quality transmission signal.

The disclosure of Japanese Patent Application No. 2005-375417, filed on Dec. 27, 2005, including the specification, drawings and abstract, is incorporated herein by reference in its entirety.

INDUSTRIAL APPLICABILITY

The transmitting apparatus of the present invention provides advantage of reducing distortion of a vector modulation wave that is a transmission output, and is applicable and useful to for example, mobile telephone devices.

The invention claimed is:

1. A transmitting apparatus comprising:
a first pulse generating section that generates an in-phase component pulse signal;
a second pulse generating section that generates a quadrature component pulse signal;
a first pulse shaping filter that receives the in-phase component pulse signal as an input signal;
a second pulse shaping filter that receives the quadrature component pulse signal as an input signal;
a first variable coefficient filter that receives the in-phase component pulse signal as an input signal;
a second variable coefficient filter that receives the quadrature component pulse signal as an input signal;
a first addition operation section that adds an output signal of the first pulse shaping filter and an output signal of the first variable coefficient filter and outputs this added signal as a first in-phase component modulation signal;
a second addition operation section that adds an output signal of the second pulse shaping filter and an output signal of the second variable coefficient filter and outputs this added signal as a first quadrature component modulation signal;
an amplitude signal voltage generating section that generates an amplitude component modulation signal using a combination of the first in-phase component modulation signal and the first quadrature component modulation signal or a combination of an output signal of the first pulse shaping filter and an output signal of the second pulse shaping filter;
a phase modulation wave generating section that generates a phase modulation wave using a signal not used in the amplitude signal voltage generating section in the combination of the first in-phase component modulation signal and the first quadrature component modulation signal or the combination of the output signal of the first pulse shaping filter and the output signal of the second pulse shaping filter; and a power amplifying section that generates a vector modulation wave acquired by amplitude-modulating the phase modulation wave in the amplitude component modulation signal.

2. The transmitting apparatus according to claim 1, wherein the first and second variable coefficient filters are finite impulse response filters.

3. The transmitting apparatus according to claim 2, wherein a transfer function coefficient sequence in the first and second variable coefficient filters is a numerical sequence of a difference between a numerical sequence acquired by sampling an impulse response waveform by a first sampling phase and a numerical sequence acquired by sampling the impulse response waveform by a second sampling phase different from the first sampling phase.

4. The transmitting apparatus according to claim 1, wherein a transfer function coefficient sequence for the first variable coefficient filter and a transfer function coefficient sequence for the second variable coefficient filter are the same numerical value.

5. The transmitting apparatus according to claim 1, further comprising a memory that stores coefficient sequences that are used for transfer function coefficient sequences for the first and second coefficient variable filters and that match respective predetermined delay times.

6. The transmitting apparatus according to claim 1, further comprising a processor that processes coefficient sequences that are used for transfer function coefficient sequences in the first and second coefficient variable filters and that match respective predetermined delay times.

7. A radio communicator comprising:
the transmitting apparatus according to claim 1;
a receiving apparatus that demodulates a received signal;
an antenna; and
a transmission/reception switching section that switches a supply of the vector modulation wave from the transmitting apparatus to the antenna and a supply of the received signal from the antenna to the receiving apparatus.

8. A transmitting apparatus comprising:
a first pulse generating section that generates an in-phase component pulse signal;
a second pulse generating section that generates a quadrature component pulse signal;
a first pulse shaping filter that receives the in-phase component pulse signal as an input signal;
a second pulse shaping filter that receives the quadrature component pulse signal as an input signal;
a first variable coefficient filter that receives the in-phase component pulse signal as an input signal;
a second variable coefficient filter that receives the quadrature component pulse signal as an input signal;
a third variable coefficient filter that receives the quadrature component pulse signal as an input signal;
a fourth variable coefficient filter that receives the quadrature component pulse signal as an input signal;
a first addition operation section that adds an output signal of the first pulse shaping filter and an output signal of the first variable coefficient filter and outputs this added signal as a first in-phase component modulation signal;
a second addition operation section that adds the output signal of the first pulse shaping filter and an output signal of the second variable coefficient filter and outputs this added signal as a second in-phase component modulation signal;
a third addition operation section that adds an output signal of the second pulse shaping filter and an output signal of the third variable coefficient filter and outputs this added signal as a first quadrature component modulation signal;
a fourth addition operation section that adds the output signal of the second pulse shaping filter and an output signal of the fourth variable coefficient filter and outputs this added signal as a second quadrature component modulation signal;
an amplitude signal voltage generating section that generates an amplitude component modulation signal from the first in-phase component modulation signal and the first quadrature component modulation signal;
a phase modulation wave generating section that generates a phase modulation wave from the second in-phase component modulation signal and the second quadrature component modulation signal; and
a power amplifying section that generates a vector modulation wave acquired by amplitude-modulating the phase modulation wave in the amplitude component modulation signal.

9. The transmitting apparatus according to claim 8, wherein the first, second, third and fourth variable coefficient filters are finite impulse filters.

10. The transmitting apparatus according to claim 9, wherein a transfer function coefficient sequence in the first, second, third and fourth variable coefficient filters is a numerical sequence of a difference between a numerical sequence acquired by sampling an impulse response waveform by a first sampling phase and a numerical sequence acquired by sampling the impulse response waveform by a second sampling phase different from the first sampling phase.

11. The transmitting apparatus according to claim 8, wherein:
a transfer function coefficient sequence in the first variable coefficient filter and a transfer function coefficient sequence in the third variable coefficient filter are the same numerical sequence;
a transfer function coefficient sequence for the second variable coefficient filter and a transfer function coefficient sequence for the fourth variable coefficient filter are the same numerical sequence; and
the transfer function coefficient sequence for the first variable coefficient filter and the transfer function coefficient sequence for the third variable coefficient filter are different numerical sequences from the transfer function coefficient sequence for the second variable coefficient filter and the transfer function coefficient sequence for the fourth variable coefficient filter.

12. The transmitting apparatus according to claim 8, further comprising a memory that stores coefficient sequences that are used for a plurality of transfer function coefficient sequences in the first, second, third and fourth coefficient variable filters and that match respective predetermined delay times.

13. The transmitting apparatus according to claim 8, further comprising a processor that processes coefficient sequences that are used for a plurality of transfer function coefficient sequences in the first, second, third and fourth coefficient variable filters and that match respective predetermined delay times.

14. A radio communicator comprising:
the transmitting apparatus according to claim 8;
a receiving apparatus that demodulates a received signal;
an antenna; and
a transmission/reception switching section that switches a supply of the vector modulation wave from the transmitting apparatus to the antenna and a supply of the received signal from the antenna to the receiving apparatus.

\* \* \* \* \*